(12) United States Patent
Sethuraman et al.

(10) Patent No.: US 11,658,159 B2
(45) Date of Patent: *May 23, 2023

(54) METHODS AND APPARATUS FOR MANAGING THERMAL BEHAVIOR IN MULTICHIP PACKAGES

(71) Applicant: Intel Corporation, Santa Clara, CA (US)

(72) Inventors: Saravanan Sethuraman, Palau Pinang (MY); Tonia Morris, Wendell, NC (US); Siaw Kang Lai, Penang (MY); Yee Choong Lim, Penang (MY); Yu Ying Ong, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/485,078

(22) Filed: Sep. 24, 2021

(65) Prior Publication Data

US 2022/0013505 A1    Jan. 13, 2022

Related U.S. Application Data

(63) Continuation of application No. 16/701,739, filed on Dec. 3, 2019, now Pat. No. 11,164,847.

(51) Int. Cl.
| | |
|---|---|
| *G11C 11/00* | (2006.01) |
| *H01L 25/065* | (2023.01) |
| *G11C 5/02* | (2006.01) |
| *G06F 12/10* | (2016.01) |

(52) U.S. Cl.
CPC ......... *H01L 25/0657* (2013.01); *G06F 12/10* (2013.01); *G11C 5/025* (2013.01); *G06F 2212/657* (2013.01); *H01L 2225/06541* (2013.01); *H01L 2225/06589* (2013.01)

(58) Field of Classification Search
CPC ..................................................... G11C 5/025
See application file for complete search history.

(56) References Cited

U.S. PATENT DOCUMENTS

| | | | |
|---|---|---|---|
| 3,487,383 A | 12/1969 | Hatton et al. | |
| 6,792,501 B2 | 9/2004 | Chen | |
| 7,463,528 B2 | 12/2008 | Mokhlesi et al. | |
| 7,822,946 B2 | 10/2010 | Sharma | |
| 8,089,795 B2 | 1/2012 | Rajan et al. | |
| 8,213,205 B2 | 7/2012 | Rakan | |
| 8,332,552 B2 | 12/2012 | Arimilli et al. | |
| 9,396,787 B2 | 7/2016 | Shoemaker et al. | |
| 9,711,487 B2 * | 7/2017 | Park ...................... | H01L 25/18 |
| 9,892,990 B1 | 2/2018 | Galloway et al. | |

(Continued)

*Primary Examiner* — Pho M Luu
(74) *Attorney, Agent, or Firm* — Fletcher Yoder, P.C.

(57) ABSTRACT

An integrated circuit may include circuitry for accessing an associated die stack. The circuitry may receive temperature information as well as a plurality of operating parameters that help determine whether it may be desirable to reroute access commands or requests to one or more die in the stack. The circuitry may include a smart crossbar switch that implements an address translation or hashing function to help map the logical user address to a physical address space. Performing thermally aware traffic management in this way can ensure that acceptable timing margins are maintained in the system to minimize the probability of errors.

20 Claims, 9 Drawing Sheets

(56) References Cited

U.S. PATENT DOCUMENTS

| | | |
|---|---|---|
| 10,083,891 B1 * | 9/2018 | Graf ........................ H01L 25/16 |
| 10,871,906 B2 | 12/2020 | Teh et al. |
| 11,164,847 B2 * | 11/2021 | Sethuraman ........ H01L 25/0657 |
| 2007/0033337 A1 | 2/2007 | Butt et al. |
| 2009/0290442 A1 | 11/2009 | Rajan |
| 2012/0124277 A1 | 5/2012 | Danilak et al. |
| 2013/0279276 A1 | 10/2013 | Schaefer |
| 2015/0095601 A1 | 4/2015 | Muralimanhar et al. |
| 2017/0192686 A1 | 7/2017 | Niu et al. |
| 2019/0393121 A1 * | 12/2019 | Swaminathan ......... H01L 24/17 |

* cited by examiner

| | User Address Range | Physical Address Range |
|---|---|---|
| Static Region 1 | 0x0000-0x1FFF | 0x0000-0x1FFF |
| Static Region 2 | ... | ... |
| ... | | |
| Static Region M | ... | ... |
| Dynamic Region 1 | ... | ... |
| Dynamic Region 2 | ... | ... |
| ... | | |
| Dynamic Region N | ... | ... | where Static Regions 1 through M are bracketed as 802 (Static Region) and Dynamic Regions 1 through N are bracketed as 804 (Dynamic Region); overall table is 800.

FIG. 8

METHODS AND APPARATUS FOR MANAGING THERMAL BEHAVIOR IN MULTICHIP PACKAGES

CROSS-REFERENCE TO RELATED APPLICATIONS

This application claims priority to U.S. application Ser. No. 16/701,739, filed Dec. 3, 2019, entitled "Methods and Apparatus for Managing Thermal Behavior in Multichip Packages," now U.S. Pat. No. 11,164,847, the disclosure of which is incorporated by reference herein in its entirety for all purposes.

BACKGROUND

This relates generally to integrated circuits and more particularly, to integrated circuit packages with more than one integrated circuit die.

An integrated circuit package typically includes an integrated circuit (IC) die and a substrate on which the die is mounted. The integrated circuit die is coupled to the substrate through bonding wires or solder bumps. Signals from the integrated circuit die travels through the bonding wires or solder bumps to the substrate.

As demands on integrated circuit technology continue to outstrip even the gains afforded by ever decreasing device dimensions, an increasing number of applications demand a packaged solution with more integration than is possible in one silicon die. In an effort to meet this need, more than one IC die may be placed within an integrated circuit package (i.e., a multichip package). As different types of devices cater to different types of applications, more IC dies may be required in some systems to meet the requirements of high performance applications. Accordingly, to obtain better performance and higher density, a multichip package may include multiple dies arranged laterally along the same plane or may include multiple dies stacked on top of one another.

In such multichip package solutions, a multichip package will typically include a main logic die and a high bandwidth memory (HBM) stack both mounted on a common interposer substrate within the multichip package. The HBM stack might include four memory dies stacked vertically on top on one another. The HBM stack is typically formed in close proximity with the main logic die or some other accelerator die in the same package and thus has unique thermal constraints.

When the operating temperature of the HBM stack surpasses a certain threshold, the HBM stack performance will suffer due to timing related issues. As temperature rises, timing margin will tend to decrease, which leads to an increase in memory errors. In one screening process, it has been discovered that 60% of parts have suffered from bit errors when reading out data from an HBM stack under test. The amount of memory errors will only be exacerbated as more memory dies are added to the HBM stack and as applications continue to push for higher bandwidth operation, thereby increasing the risk of high temperature timing violations.

It is within this context that the embodiments described herein arise.

BRIEF DESCRIPTION OF THE DRAWINGS

FIG. 8 is a diagram showing how an address space may be divided into a static region and a dynamic region in accordance with an embodiment.

DETAILED DESCRIPTION

Figure 1:
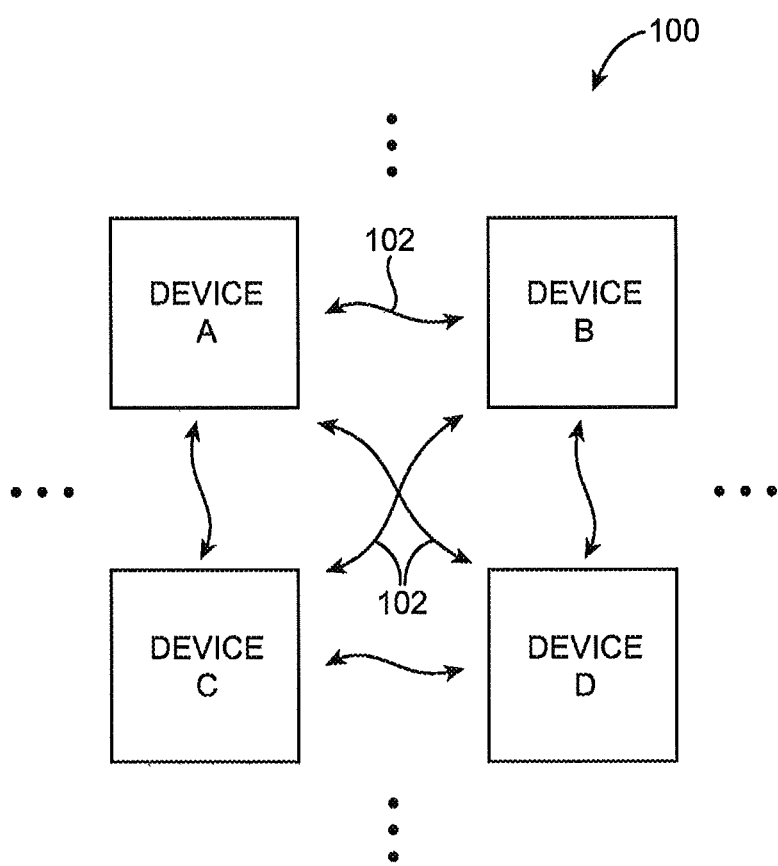
FIG. 1 is a diagram of an illustrative system of integrated circuit devices operable to communicate with one another in accordance with an embodiment.

The present embodiments relate to various methods for managing the thermal characteristics within a multichip package that includes a main die operable to communicate with an associated die stack via corresponding channels. In one suitable arrangement, a thermal controller circuit on the main die may be configured to receive multiple operating parameters from one or more dies within the die stack and to selectively throttle accesses to the hotter dies. A die may be considered to be "hot" if its temperature is determined to be greater than a predetermined temperature threshold (e.g., if the temperature reading exceeds 30° C., 40° C., 50° C., 60° C., 70° C., 80° C., 90° C., 100° C., or beyond). A die may be considered "cold" or not at risk for timing violations if the temperature is below the predetermined thermal threshold. For example, the controller may estimate the number of commands that are being sent to each die within a given time window and flag the cases where it would likely exceed a predetermined thermal limit.

The thermal controller circuit may also reroute a busy traffic channel to a less loaded channel to maintain an acceptable thermal profile on the die stack with the help of address translation (e.g., by snooping the addresses going to the different channels and enabling the timers accordingly) and smart crossbar swizzling techniques. The address translation may remap the physical address on writes and may preserve this remapping until the next write to the same address.

The controller circuit may also be configured to obtain or otherwise accurately estimate/predict the temperature or one or more dies within the die stack. Retrieving temperature from only the bottom die in the die stack is insufficient to make proper decisions for the entire die stack. Thus, the controller may retrieve temperature information from not only the bottom die but also the top die in the die stack to obtain a corresponding temperature gradient to help estimate the temperature of any of the middle dies sitting in between the top and bottom dies. After detecting the temperature reading for each of the dies in the die stack, the commands may be swizzled in such a way that cold dies is accessed more often than the hotter dies. In the case of a mirrored memory subsystem, the controller may only perform reads from the mirrored copy instead of the main copy to help avoid temperature increases in the main copy rather than distributing the read across other dies in the stack.

At the system level, the applications should know where future writes should be placed to avoid thermal issues across multiple die stacks in the system. The thermal controller may also implement some type of command rescheduling mechanism (e.g., a round robin movement) to prevent any one die within the HBM from heating up too quickly.

Configured and operated in this way, system crash can be avoided (i.e., by removing the major root cause of errors due to rise in temperature) while running mission critical applications on systems that might rely on the use of packages with stacked dies for both existing and future products. In one example, the die stack may be part of a data center that processes a variety of different requests. For instance, the data center may receive a data processing request to perform encryption, decryption, machine learning, video processing, voice recognition, image recognition, data compression, database search ranking, bioinformatics, network security pattern identification, spatial navigation, or some other specialized task.

It will be recognized by one skilled in the art, that the present exemplary embodiments may be practiced without some or all of these specific details. In other instances, well-known operations have not been described in detail in order not to unnecessarily obscure the present embodiments.

FIG. 1 is a diagram of an illustrative system 100 of interconnected electronic devices. The system of interconnected electronic devices may have multiple electronic devices such as device A, device B, device C, device D, and interconnection resources 102. Interconnection resources 102 such as conductive lines and busses, optical interconnect infrastructure, or wired and wireless networks with optional intermediate switching circuitry may be used to send signals from one electronic device to another electronic device or to broadcast information from one electronic device to multiple other electronic devices. For example, a transmitter in device B may transmit data signals to a receiver in device C. Similarly, device C may use a transmitter to transmit data to a receiver in device B.

The electronic devices may be any suitable type of electronic device that communicates with other electronic devices. Examples of such electronic devices include integrated circuits having electronic components and circuits such as analog circuits, digital circuits, mixed-signal circuits, circuits formed within a single package, circuits housed within different packages, circuits that are interconnected on a printed-circuit board (PCB), etc.

As integrated circuit technology scales towards smaller device dimensions, device performance continues to improve at the expense of increased power consumption. In an effort to reduce power consumption, more than one die may be placed within a single integrated circuit package (i.e., a multichip package). As different types of devices cater to different types of applications, more dies may be required in some systems to meet the requirements of high performance applications. Accordingly, to obtain better performance and higher density, an integrated circuit package may include multiple dies arranged laterally along the same plane and/or may include one or more dies stacked on top of one another.

Figure 2:
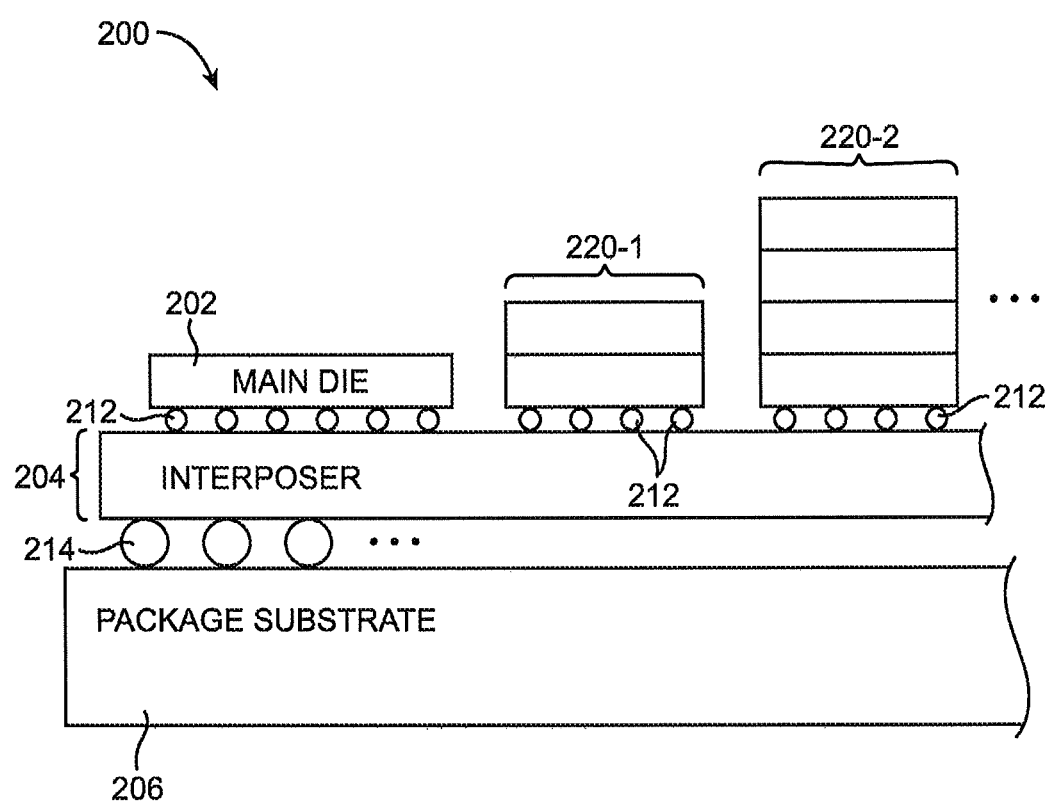
FIG. 2 is a cross-sectional side view of an illustrative multichip package in accordance with an embodiment.

FIG. 2 is a cross-sectional side view of an illustrative multichip package 200 that includes a package substrate 206, an interposer die 204 mounted on package substrate 206, and multiple dies mounted on top of interposer 204. Interposer 204 may be an active device (e.g., a die that includes transistors or other active components that can be powered) or a passive device (e.g., a die that does not include any active components). A main die 202 (e.g., an application-specific integrated circuit, a programmable integrated circuit such as a field-programmable gate array, a graphics processing unit, or other processor) and one or more die stacks 220 may be mounted on interposer 204. Main die 202 is sometimes referred to as the main logic die.

In the example of FIG. 2, at least a first die stack 220-1 and a second die stack 220-2 may be mounted on interposer 204. The first die stack 220-1 includes two integrated circuit dies stacked vertically with respect to one another, whereas the second die stack 220-2 includes four integrated circuit dies stacked vertically with respect to one another. This arrangement is merely illustrative. In general, any number of die stacks 220 may be mounted on interposer 204 and coupled to the main die 202, where each die stack 220 may include at least two vertically stacked dies, at least three vertically stacked dies, at least four vertically stacked dies, 4-8 vertically stacked dies, 8-12 vertically stacked dies, 12-16 vertically stacked dies, or more than 16 vertically stacked dies. The various dies in each die stack may communicate with one another via communication paths sometimes referred to as through silicon vias (TSVs) or other suitable interconnect structures.

Microbumps 212 may be formed at the top surface of interposer 204 to interface with the main die 202 and the die stacks 220. Bumps such as controlled collapse chip connection (C4) bumps 214 (sometimes referred to as flip-chip bumps) may be formed at the bottom surface of interposer 204. Generally, C4 bumps 214 (e.g., bumps used for interfacing with off-package components) are substantially larger in size compared to microbumps 212 (e.g., bumps used for interfacing with other dies within the same multichip package). The number of microbumps 212 is also generally much greater than the number of flip-chip bumps 214 (e.g., the ratio of the number of microbumps to the number of C4 bumps may be greater than 2:1, 5:1, 10:1, etc.).

Device configurations in which one or more die stack 220 within the multichip package is a memory stack (e.g., a stack of memory devices) such as the JEDEC JESD235 High Bandwidth Memory (HBM) DRAM memory stack is sometimes described as an example herein. This is, however, merely illustrative. The techniques and improvements described herein may be applied to not only stacked memory chips but also extended to stacked transceiver chips, stacked networking adapter chips, stacked discrete components, stacked configuration devices, stacked debugging chips, and/or other types of stacked storage and processing components within a multichip package.

As alluded to in the Background Section, products that include die stacks such as HBM stacks often suffer from timing related issues when the temperature exceeds a certain threshold. When the temperature is too high, timing margin degrades and the system will start experiencing memory errors. Conventional approaches for mitigating thermal issues only involve reading temperature from only the bottommost base die in the HBM stack, selectively shutting down the associated communication channel (which is undesirable), scrambling the memory data, and using heat sink solutions. As the stack density continues to increase and as vendors continue to add more dies to increase the stack height, the conventional schemes will no longer be able to efficiently mitigate such thermal related issues when the HBM stack is experiencing peak traffic or when the same die in the stack is being repeatedly accessed by the memory controller. The prior approaches also do nothing when one of the middle dies in the HBM stack is under stress.

Figure 3:
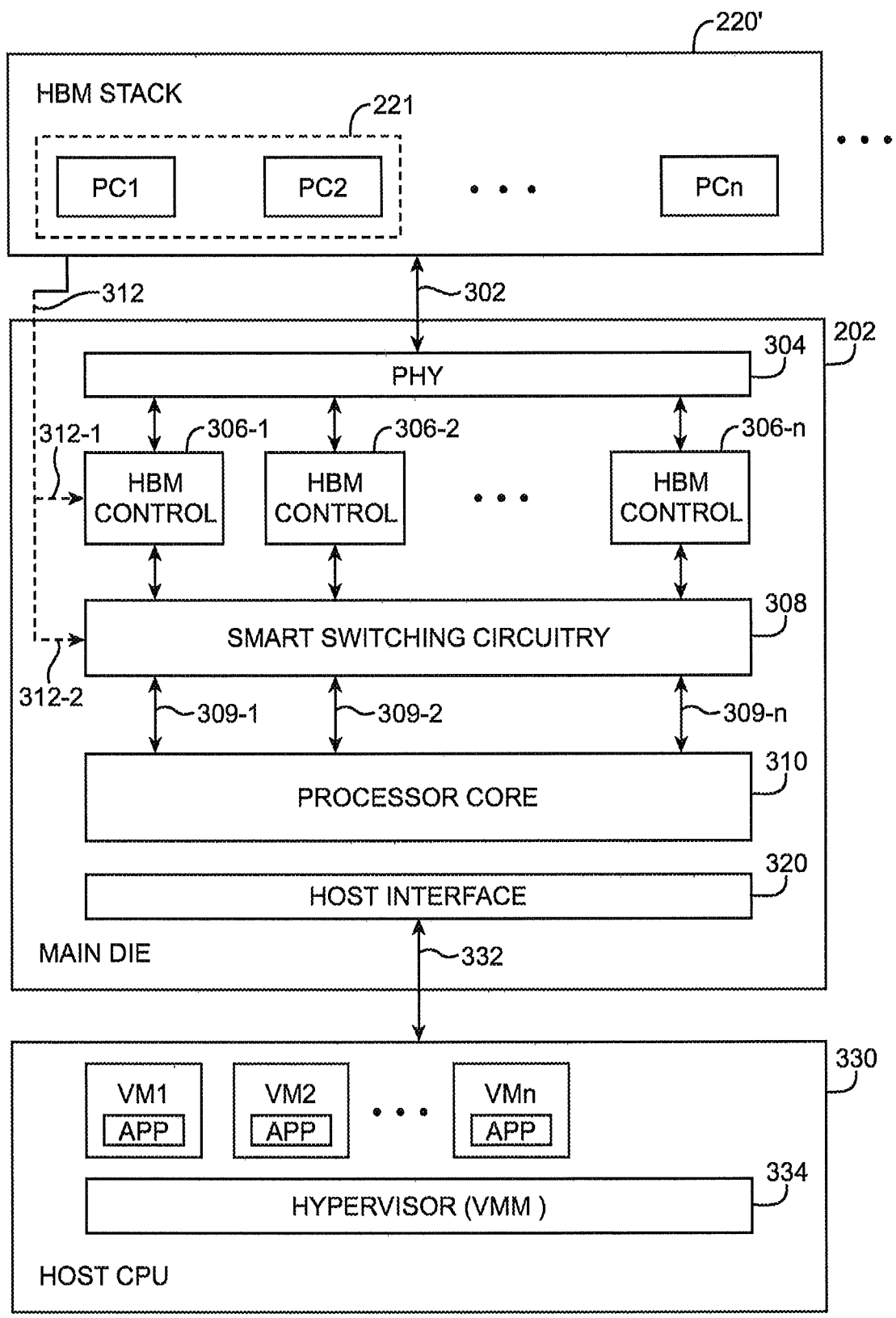
FIG. 3 is a diagram of an illustrative system that includes a main die coupled to an associated memory die stack and a host processor in accordance with an embodiment.

FIG. 3 is a diagram of an illustrative system that includes a main die 202 coupled to an associated memory die stack 220' and a host processor 330 in accordance with an embodiment. Memory die stack 220' may be an HBM stack, a die stack with only non-volatile memory chips, a die stack with only volatile memory chips, a die stack with both volatile and non-volatile memory chips, or a die stack with other types of integrated circuit devices. As shown in FIG. 3, HBM stack 220' may include multiple pseudo-channels (PCs). For example, memory stack 220' may include a first pseudo-channel PC1, a second pseudo-channel PC2, ..., and an $n^{th}$ pseudo-channel PCn, where n may be equal to 2, 4, 8, 16, 2-16, more than 16, or any suitable integer. In one suitable arrangement, two pseudo-channels may be associated with a given memory die in the HBM stack (e.g., PC1 and PC2 may be associated with one of the dies in the stack, as indicated by dotted box 221). In general, at least one pseudo-channel may be associated with a given die in the HBM stack or more than two pseudo-channels may be associated with a given die in the HBM stack.

Each pseudo-channel may have its own dedicated controller such as HBM control circuit 306 (see, e.g., HBM controller 306-1 associated with PC1, HBM controller 306-2 associated with PC2, ..., and HBM controller 306-$n$ associated with PCn) that is formed on main die 202. In other embodiments, multiple pseudo-channels may have their own shared/dedicated memory controller. In the scenario where two pseudo-channels share a common memory controller, commands from the two pseudo-channels may be scheduled on alternating cycles. HBM stack 220' may communicate with the corresponding controllers 306 via a physical-layer interface component (oftentimes abbreviated as "PHY") 304 within the main die 202 via inter-die path 302. The PHY component 304 may include physical medium dependent (PMD) sublayer blocks (e.g., transceiver blocks), physical coding sublayer (PCS) blocks (e.g., a sublayer that determines when a functional link has been established and performs coding such as 64$b$/66$b$ encoding), and physical medium attachment (PMA) blocks that serve as an interface between the PMD blocks and the PCS blocks.

The memory controllers 306 may be coupled to a processor core 310 within main die 202 via respective on-chip high speed interconnect interface buses such as the Advanced eXtensible Interface (AXI) interface (see, e.g., AXI interface buses 309-1, 309-2, ..., 309-$n$). Although the AXI interface is sometimes described herein as an example, other types of high frequency multi-master/multi-slave on-chip interface or high-speed protocol-driven intra-die communication interface may be used. Processor core 310 may be a soft processor core (e.g., a processor core that is statically or dynamically reconfigurable) or a hard processor core (e.g., a processor core that is non-reconfigurable and is hardwired to perform a given range of functions). In some embodiments, the processor core 310 may be coupled to the HBM controllers via smart switching circuitry 308. The smart switching circuitry 308 that is interposed between the processor core and the memory controllers may be configured to selectively re-route traffic between different pseudo-channels within a given die in the HBM stack or between different dies within the memory stack based on information received from the HBM subsystem, as optionally provided over signal path 312.

Main die 202 may further include an input-output component such as host interface 320 that is configured to communicate with a host central processing unit (CPU) via path 332. Path 332 may be a coherent computer bus interface such as UltraPath Interconnect (UPI), QuickPath Interconnect (QPI), Compute Express Link (CXL), Cache Coherent Interconnect for Accelerators (CCIX), Gen-Z, Open Coherent Accelerator Processor Interface (OpenCAPI), Intel Accelerator Link (IAL), Nvidia's NVLink, or other computer bus interfaces. Path 332 may also include a non-coherent computer bus interface such as the PCIe (Peripheral Component Interconnect Express) interface. In general, host interface(s) 320 may be implemented using multiple data lanes (e.g., at least 2 lanes, at least 4 lanes, at least 8 lanes, at least 16 lanes, at least 32 lanes, at least 64 lanes, etc.), single data lane, parallel data bus, serial data bus, or other computer bus standards that can support data transfer rates of at least 250 MBps (megabytes per second), 500 MBps, 1 GBps (Gigabytes per second), 5 GBps, 10 GBps, 16 GBps, 32 GBps, 64 GBps, or more.

A host operating system (OS) may be loaded on host CPU 330 (sometimes referred to simply as the "host" or host processor). The host OS may implement a hypervisor 334 that facilitates the use of one or more virtual machines (e.g., virtual machines VM1, VM2, ..., VMn) on host processor 330. Virtual machines are self-contained virtualized partitions that simulate an independent hardware computing resource. Each virtual machine is therefore capable of running one or more applications (see App). If desired, a single application might run on two or more virtual machines. Hypervisor 334 may be part of the software or firmware running on host processor 334 and may serve as a virtual machine monitor (sometimes also referred to as a virtual machine manager or VMM) that manages the system's hardware resources so they are distributed efficiently among the virtual machines (VMs) within the system.

Each virtual machine may be referred to as a "guest" machine running its own guest operating system (OS). Each virtual machine may be used to run one or more user applications. Hypervisor 334 presents the VM's guest OS with a virtual operating platform and manages the execution of the guest operating systems while sharing virtualized hardware resources. Hypervisor 334 may run natively on the host's hardware (as a type-1 "bare metal" hypervisor) or may run on top of an existing host operating system (as a type-2 "hosted" hypervisor). If desired, additional virtualization drivers and tools (not shown) may be used to help each guest virtual machine communicate more efficiently with the underlying physical hardware of host CPU 330. In general, processor 330 may be configured to host at least two VMs, two to ten VMs, more than ten VMs, hundreds of VMs, thousands of VMs, or any suitable number of virtual machines.

In general, the software running on host CPU 330 may be implemented using software code stored on non-transitory computer readable storage media (e.g., tangible computer readable storage media). The software code may sometimes be referred to as software, data, program instructions, instructions, script, or code. The non-transitory computer readable storage media may include non-volatile memory such as non-volatile random-access memory (NVRAM), one or more hard drives (e.g., magnetic drives or solid state drives), one or more removable flash drives or other removable media, or the like. Software stored on the non-transitory computer readable storage media may be executed on the processing circuitry of host processor 330.

Figure 4:
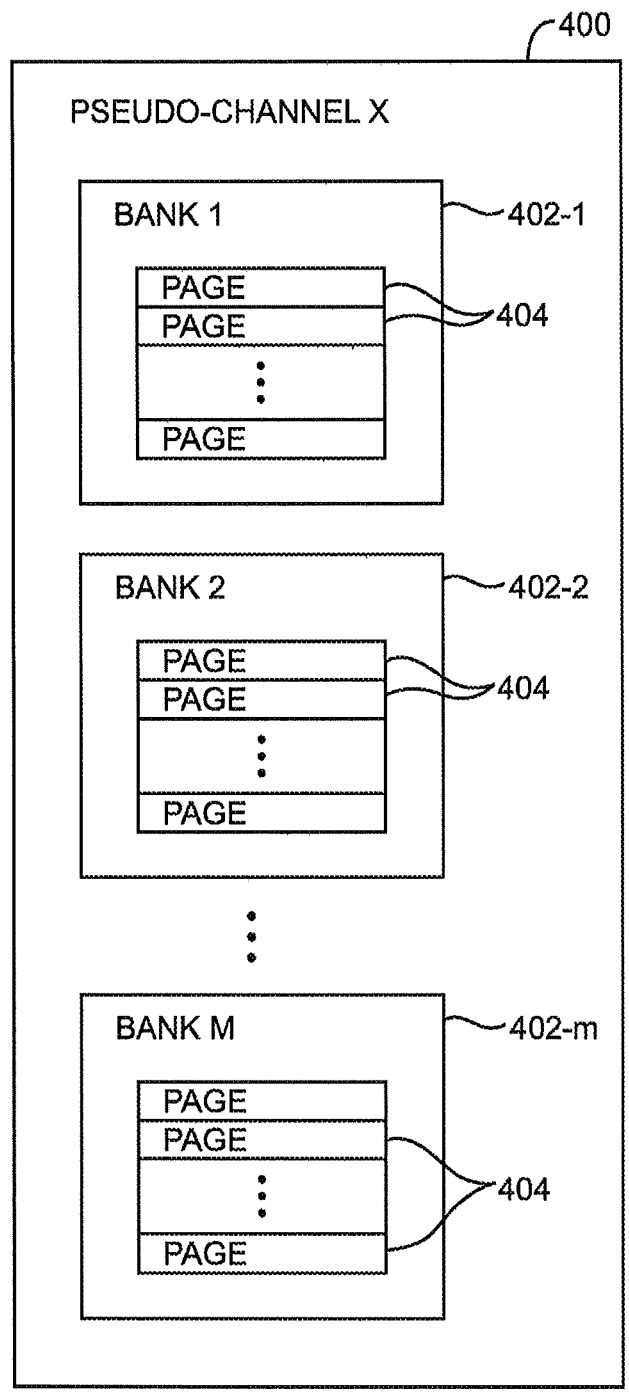
FIG. 4 is a diagram of an illustrative pseudo-channel that includes multiple memory banks in accordance with an embodiment.

Many thermal management capabilities can be provided at the memory controllers 306. Before describing the various parameters that might be considered by the memory controllers to throttle the memory commands, it is helpful to first understand how pseudo-channels are organized. FIG. 4 is a diagram of an illustrative pseudo-channel 400 that includes multiple memory banks. As shown in FIG. 4, pseudo-channel 400 may contain multiple memory banks (e.g., a first memory bank 402-1, a second memory bank 402-2, . . . , and an $m^{th}$ memory bank 402-$m$). Each memory bank 402 may include multiple rows or pages 404. Each bank 402 can only maintain a single open page. Thus, to access a different page within a memory bank, the existing page must be closed before opening the desired page.

Figure 5:
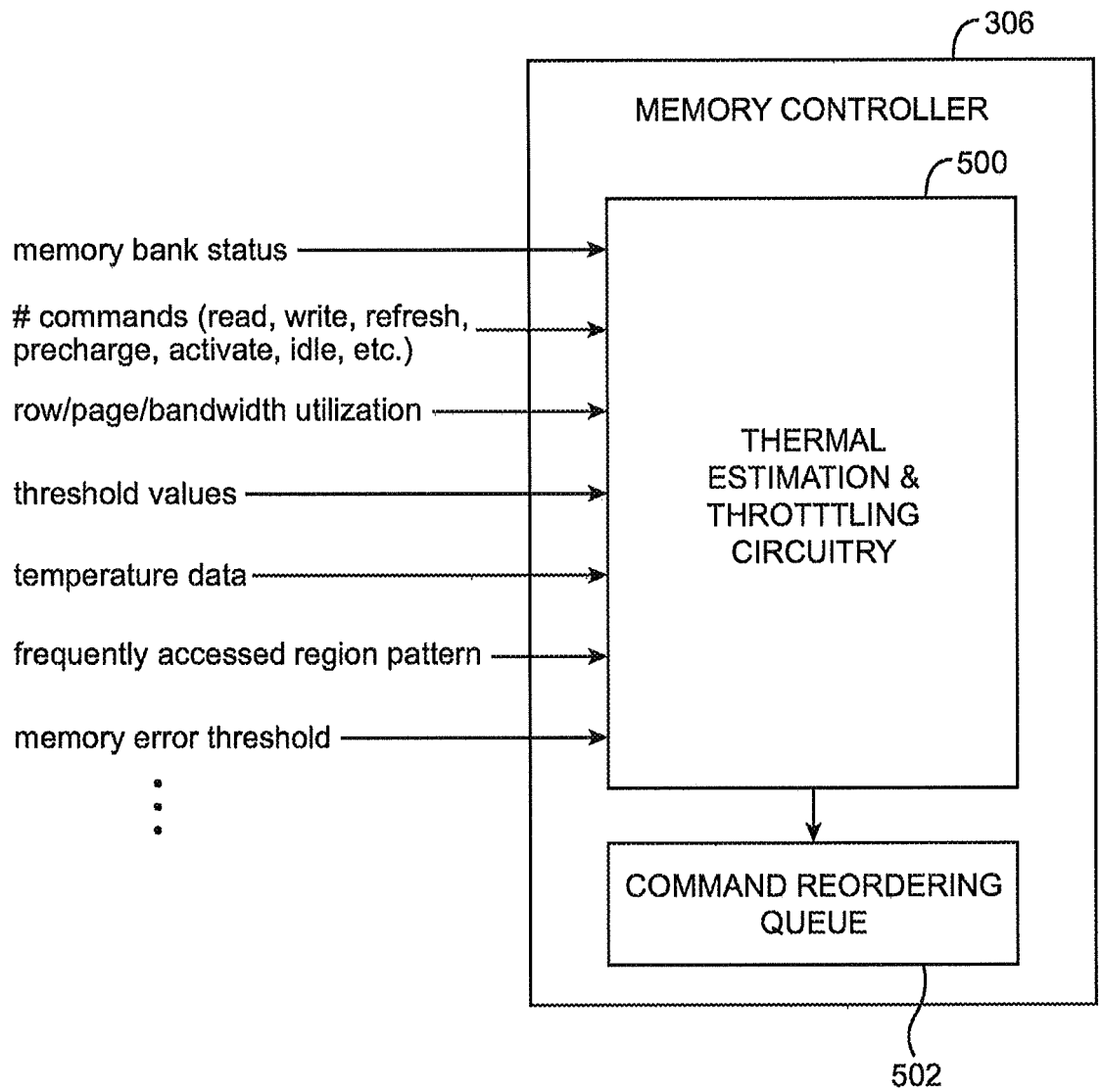
FIG. 5 is a diagram of an illustrative memory controller circuit configured to perform thermal throttling based on multiple operating parameters in accordance with an embodiment.

FIG. 5 is a diagram of memory controller circuit 306 configured to perform thermal throttling based on one or more operating parameters received from the memory stack (see, e.g., path 312-1 in FIG. 3). As shown in FIG. 5, memory controller 306 may include thermal estimation and throttling circuitry 500 configured to receive the plurality of operating parameters/metrics (sometimes referred to collectively as thermally aware information or statistics).

In one suitable embodiment, the memory controller may receive different types of statistical or monitoring information, which may include a memory bank status, a number of commands (e.g., the number of read requests, write requests, refreshes, precharges, activates, idle commands, etc.), a row/page/bandwidth utilization metric, one or more threshold values such as a utilization threshold value and a memory error threshold such as an error correcting code (ECC) threshold value, and temperature data. This list is by no means meant to be exhaustive. Based on these parameters, the memory controller may reroute traffic within or among the various pseudo-channels of a single die in the memory stack. If desired, these parameters may also be forwarded to the smart switching circuitry 308 (see, e.g., path 312-2 in FIG. 3) so that the smart switching circuitry 308 can spread memory accesses across the whole memory stack to fully utilize the available bandwidth.

In another suitable embodiment, the received threshold values may also include a row or page level threshold count value that records the number of consecutive accesses to a given row/page. A situation where one page is continuously accessed is sometimes referred to as a "row hammer" issue, which can occur when the system is under attack or during some other uncommon scenario. By monitoring the page count value, the memory controller is able to avoid the row hammer issue and can also relieve thermal stress on the die under attack.

In yet another suitable arrangement, the memory controller may reroute traffic based on a frequently accessed region pattern (e.g., it may be desirable to route traffic to areas of the die that is less frequently accessed). For example, the memory controller may provide feedback to the application running on the corresponding virtual machine on which die region is better to write by sending an encoded flag as part of performance monitors or by exposing this information in terms of an address range.

Still referring to FIG. 5, thermal estimation and throttling circuitry 500 may direct a command reordering queue 502 to selectively reorder the commands based on the thermal aware statistics. For example, consider an example in which an HBM stack includes dies D0, D1, D2, and D3, where D2 is currently hot and D0 is cool. If the commands being issued target D0, D2, D2, D2, D2, D0, D1, and D3 in this order, the associated memory controllers may throttle their command reordering queues 502 such that the commands intended for dies D0, D1, and D3 are executed first to allow die D2 to cool down before being accessed. If desired, the command reordering queue may also be formed at the HBM module 220' (FIG. 3) so that commands are queued and reordered locally at the memory stack.

Figure 6:
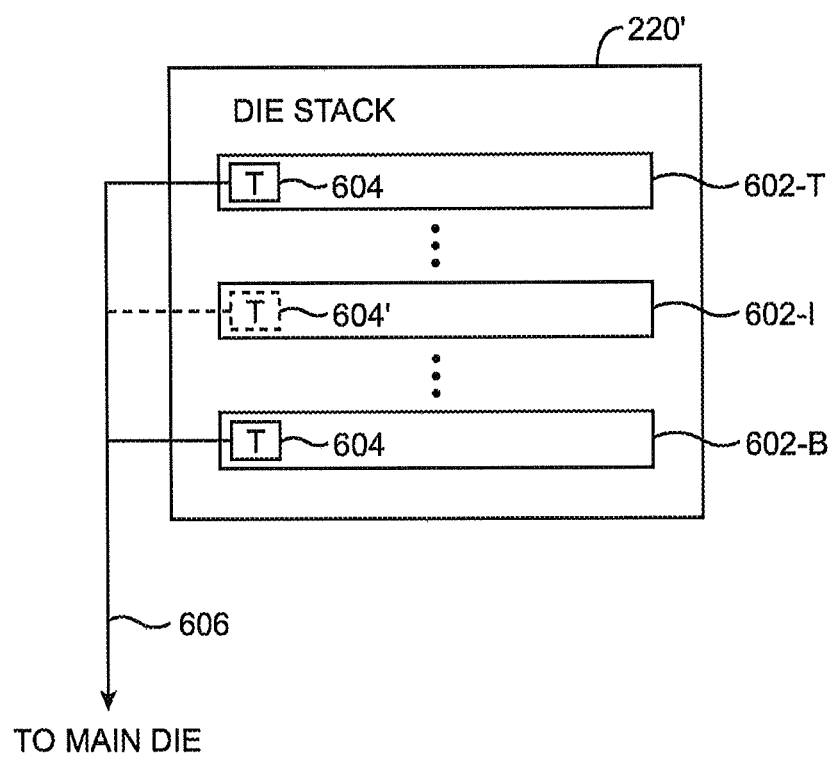
FIG. 6 is a diagram showing how temperature information may be obtained from more than one die within a die stack in accordance with an embodiment.
Figure 7:
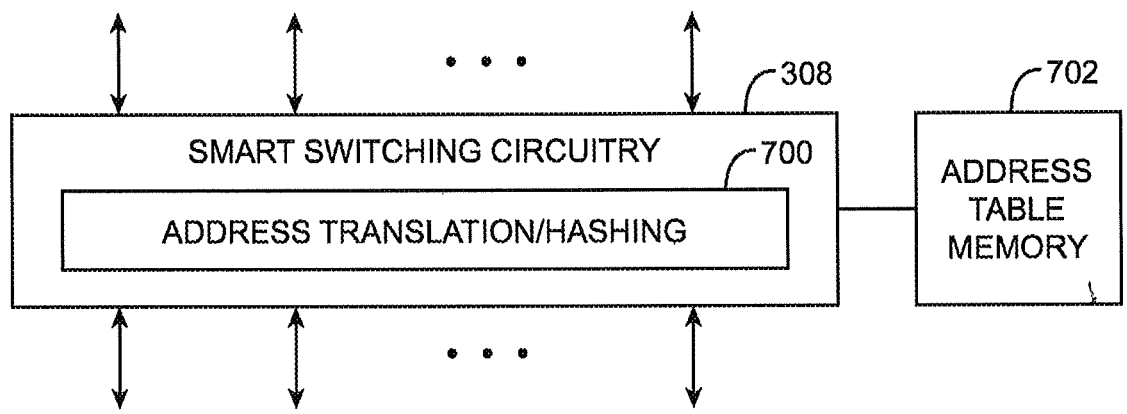
FIG. 7 is a diagram of illustrative smart switching circuitry configured to perform address translation/hashing in accordance with an embodiment.

In yet another suitable embodiment, the memory controller may analyze the temperature data received from the HBM stack and may selectively limit the traffic activity for one or more dies in the stack depending on the temperature data. FIG. 6 is a diagram showing how temperature information may be obtained from more than one die within die stack 220'. As shown in FIG. 6, die stack 220' may include any desired number of stacked dies 602 (e.g., at least two 3D stacked dies, at least three 3D stacked dies, at least four 3D stacked dies, 4-12 stacked dies, more than 12 stacked dies, etc.).

The bottommost die 602-B in the die stack may have a temperature sensor 604 that provides temperature information for that die to the memory controllers and/or the smart switching circuitry on the main die. Moreover, the bottommost die 602-T in the die stack may also have a temperature sensor 604 that provides temperature information for that die to the memory controllers and/or the smart switching circuitry on the main die. With this information, the thermal estimation circuitry 500 within the memory controller (see FIG. 5) is able to compute a temperature gradient to interpolate the temperature for any one of the intermediate dies such as die 602-I in the die stack. If desired, intermediate die 602-I may also include its own dedicated temperature sensor 604' to provide a more accurate reading than the interpolated results. Configured in this way, the memory controller may throttle commands (e.g., by allowing only 50% or other subset of commands to be executed) to one or more dies in the stack when the temperature or other information such as an activity tracker reaches or exceeds a certain threshold or thermal limit.

In accordance with yet another suitable embodiment, the smart switching circuitry 308 may be provided with an address translation circuit 700 configured to map logical (user) addresses to physical (memory) addresses. Address translation circuitry 700 may implement either static address translation (where the logical and physical address relationship is fixed) or dynamic address translation (where the logical and physical address mapping may be dynamically adjusted based on some predetermined algorithm). For dynamic address translation, circuit 700 dynamically remaps the physical address on writes and preserves this remapping until the next write to the same address. Performing remapping in this way can help distribute the memory usage across different levels (i.e., across different regions of a given die or across different dies in a chip stack). If desired, the remapping provided by the address translation layer may also be implemented within each memory controller at the system level. Additional address bits may be used to indicate to the application which mapping was used or expected. Smart switching circuitry 308 may (as an example) be implemented as a crossbar switch, so the address remapping may sometimes be referred to as crossbar swizzling.

The different channels (including pseudo-channels) may appear as one continuous address space to the user. FIG. 8 is a diagram showing how an address space 800 may be divided into a static region 802 and a dynamic region 804 in accordance with an embodiment. The size of the static region 802 and dynamic region 804 can be changed based on the needs of the application. As shown in FIG. 8, region 802 may be divided into M static sub-regions, whereas region 804 may be divided in N dynamic sub-regions. The number of regions within regions 802 and 804 can be changed.

In one suitable arrangement, the physical address may include channel address bits, a stack identifier identifying a selected die in the stack, bank address bits, row address bits, column address bits, etc. The mapping from the user logical address to the physical memory address may be based on a few predefined or user-defined hash functions and is typically a one-to-one mapping. The contents of address table 800 may be stored within address table memory 702, which serves as an address translation lookup table for determining which address needs to go where to maintain the desired thermal stability within the memory stack.

Table memory 702 (sometimes also referred to as a page table) may also maintain a threshold counter for checking whether access to a certain address has reached its limits or to determine whether a given die or page is suffering from a row hammer kind of specified attack. For example, if the memory controller or the smart switching circuitry determines that recent accesses is always target a small number of banks, a new dynamic hashing function should focus on spreading the access across multiple channels, pseudo-channels, or banks. The address table may be stored in an on-chip memory (e.g., on-chip SRAM block), on the HBM stack, or on both the on-chip memory and the HBM stack. If desired, the application running on the host processor may communicate with the memory controller to effectively manage the address locations, to expose a read address range where future writes are desired, to dynamically allocate or deallocate the address space based on temperature and other statistic, etc.

As described above, one type of address translation that can be supported by circuit 700 is address hashing. Consider for example a scenario in which the memory physical address is computed by taking the exclusive-OR (XOR) of the logical user address and a predetermined hash value. Thus, if the user address is "0x0000" and the hash function is "0x5555", then the corresponding physical address would be equal to "0x5555". As another example, if the user address is "0x0001" and the hash function is "0x5555", then the corresponding physical address would be equal to "0x5554". This example is merely illustrative. In general, any type of static/dynamic address translation or hashing function may be used to redistribute commands to different portions of a die stack.

In general, smart switching circuitry 308 may be configured to reroute traffic to and from the die stack to spread accesses/commands across the whole die stack to maintain an even temperature spread at a system level (e.g., to ensure that no one die becomes excessively hotter than another).

For example, a graphics intensive workload bandwidth will be around 85% of the maximum capacity and it will be read intensive with few page hits. Such types of workload would increase the current draw requirement, which in turn increases the temperature significantly due to the need to precharge and refresh each page/row after each read. Consider a scenario where an 8 Gb HBM device includes a stack of eight dies high with 4 Gb per channel (e.g., each die has two pseudo-channels) and addressed using 14 row address bits, 6 column address bits, 4 bank address bits, and where the total page size is 2 KB (e.g., 1 KB for each pseudo-channel).

After analyzing one or more parameters received from the die stack (see, e.g., the received parameters/metrics in FIG. 5, which can also be fed to the smart switching circuitry in parallel) or after computing the temperature of one or more dies in the stack, the smart switching circuitry may utilize the address translation/hashing circuit to swizzle the pseudo-channels by considering the HBM level address and the higher order address bits at the crossbar switch level so that the commands are distributed evenly. The term "swizzle" may be defined as reordering, redistributing, mixing, randomizing, or otherwise rerouting the memory commands/requests.

As an example, the smart switching circuitry in conjunction with one or more memory controllers may cycle commands through each die in the stack in a round robin movement so that the requests are distributed evenly across the stack instead of addressing the same die again and again. This can be achieved using an address hashing algorithm where the least significant bits (LSBs) are the die address bits. Consider a scenario in which an HBM stack includes 8 vertically stacked memory chips, so a chip identifier (ID) with three bits would be sufficient to address the 8 dies. In this scenario, the 3-bit chip ID may be the LSBs, whereas the higher order bits might include row address bits, column address bits, bank address bits, rank bits, etc. Configured in this way, an address counter that increments the LSBs would effectively swizzle the commands to different dies in the round robin fashion. This round robin movement is merely illustrative. The user can also optionally reassign the addresses so that the swizzling is carried out in some other predetermined or random manner.

The smart switching circuitry (e.g., a crossbar switch) may also perform swizzling mainly based on temperature (which may be given a higher weighting factor or credit), the bank status of each die, the bandwidth utilization (e.g., the command rate within the allowed clock cycle cycle) of each of the pseudo-channels, the latency priority of each command, etc. If desired, data may also be optionally scrambled at the smart switching circuitry to maintain randomness instead of scrambling data at the channel level. Performing data scrambling at the crossbar switch level can help provide improved flexibility. In yet other suitable embodiments, data stored on the memory stack may be mirrored (e.g., a main copy and a duplicate copy are both stored) and when it is desired to access that piece of data, only one of the main copy or the mirror copy may be read, whichever one is cooler. In some embodiments, pseudo-channels might be converted into multiple virtual ranks inside the HBM channels such that the virtual ranks can be individually controlled to support actions like mirroring or rank interleaving to improve throughput for high-intensive workloads such as networking and artificial intelligence (AI) applications. The memory control circuits (e.g., the HBM controllers) and the smart switching circuitry configured in these ways may sometimes be referred to collectively as activity/thermal monitoring circuitry, thermally-aware traffic rerouting circuitry, or control circuitry.

Figure 9:
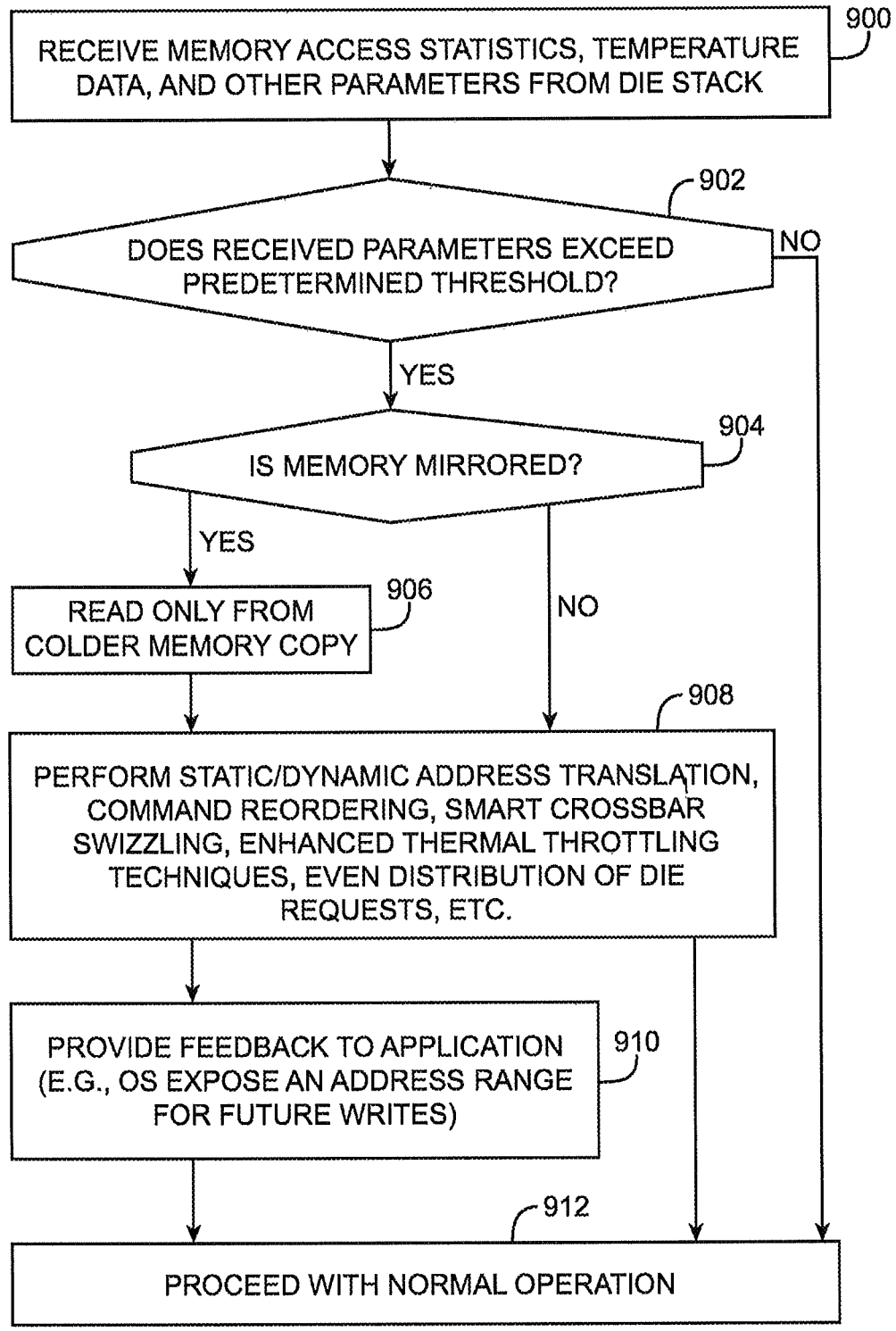
FIG. 9 is a flow chart of illustrative steps for operating the circuits show in connection with FIGS. 2-7 in accordance with an embodiment.

FIG. 9 is a flow chart of illustrative steps for operating the circuits show in connection with FIGS. 2-7. At step 900, the memory controller(s) and/or the smart switching circuitry may receive memory access statistics, temperature data, and other parameters from the die stack (e.g., from the HBM die stack or other types of chip stack). The memory access statistics may include bank status, command utilization, the number of commands to each die, a row threshold counter and bandwidth, error threshold, frequently accessed region pattern, and/or other metrics that might help estimate the thermal behavior on the die stack.

At step 902, the memory controller and/or the smart switching circuitry may determine whether the received parameters/statistics exceed predetermined threshold values. If not, the system may proceed with the normal desired operation (step 912). In response to determining that the received parameters exceed the predetermined threshold values, processing may proceed to step 904 to determine whether the memory is mirrored. If the memory is mirrored, only the colder copy will be read (step 906).

If the memory is not mirrored, the smart switching circuitry and/or the memory controller(s) may perform static/dynamic address translation or hashing, command reordering, smart crossbar switching, enhanced thermal throttling techniques (e.g., throttling operations that perform throttle not only based on the base die temperature but takes into account a plurality of additional parameters), and other suitable re-routing schemes to ensure an even distribution of die requests to prevent any one die in the stack from heating up too quickly. If desired, the smart switching circuitry and/or the memory controller(s) may provide additional feedback to the application running on the host CPU (e.g., to expose an address range for future writes, etc.). Thereafter, processing may proceed with the normal operation at step 912.

The examples described above in which the memory controllers 306 and/or the smart switching circuitry 308 are configured to receive statistical information from the memory stack 220' is merely illustrative and is not intended to limit the scope of the present embodiments. In yet other suitable arrangements, the memory controller and/or the smart switching circuitry may be capable of independently tracking the statistics of interest (e.g., the number of page openings/closings) and other data that can help determine the relative thermal conditions of the IC chips in the die stack.

Although the methods of operations are described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Examples

The following examples pertain to further embodiments.

Example 1 is an integrated circuit, comprising: an interface circuit configured to communicate with an external die stack having a plurality of vertically stacked dies; and control circuitry configured to analyze information associated with the external die stack and to distribute accesses among the plurality of vertically stacked dies to prevent any one of the plurality of vertically stacked dies from exhibiting a temperature that exceeds a predetermined thermal limit.

Example 2 is the integrated circuit of example 1, wherein the analyzed information optionally comprises parameters selected from the group consisting of: a memory bank status, a number of commands, a memory bandwidth utilization metric, at least one threshold value, and number of page openings and closures.

Example 3 is the integrated circuit of any one of examples 1-2, wherein the analyzed information optionally comprises a memory error threshold value.

Example 4 is the integrated circuit of any one of examples 1-3, wherein the analyzed information optionally comprises a frequently accessed region pattern of a given die in the external die stack.

Example 5 is the integrated circuit of any one of examples 1-4, wherein the analyzed information optionally comprises temperature data associated with more than one of the vertically stacked dies in the external die stack.

Example 6 is the integrated circuit of example 5, wherein the temperature data optionally includes a first temperature sensor measurement from a topmost die in the external die stack and a second temperature sensor measurement from a bottommost die in the external die stack.

Example 7 is the integrated circuit of example 6, wherein the control circuitry is optionally further configured to compute a temperature gradient based on the first and second temperature sensor measurements to estimate a temperature level for an intermediate die interposed between the topmost and bottommost dies in the external die stack.

Example 8 is the integrated circuit of any one of examples 1-7, wherein the control circuitry optionally comprises memory controller circuits configured to throttle traffic intended for hot dies in the die stack.

Example 9 is the integrated circuit of any one of examples 1-8, wherein the control circuitry optionally comprises memory controller circuits configured to reroute traffic from a congested channel to a less congested channel to balance a thermal profile across the die stack.

Example 10 is the integrated circuit of any one of examples 1-9, wherein the control circuitry optionally comprises switching circuitry configure to swizzle accesses to the external die stack such that cold dies in the die stack are accessed more often than hot dies in the die stack.

Example 11 is the integrated circuit of example 10, wherein the switching circuitry optionally comprises an address translation circuit configured to map logical addresses to corresponding physical addresses.

Example 12 is the integrated circuit of example 11, wherein the address translation circuit is optionally configured to perform static address mapping.

Example 13 is the integrated circuit of example 11, wherein the address translation circuit is optionally configured to perform dynamic address mapping.

Example 14 is the integrated circuit of any one of examples 1-13, wherein the external data is optionally configured to store a main copy of a given data and a mirrored copy of the given data, and wherein the control circuitry is configured to only access a selected one of the main copy and the mirrored copy with the lower temperature.

Example 15 is a method of operating an integrated circuit die, comprising: with an interface circuit in the integrated circuit die, communicating with an external chip stack; with control circuitry in the integrated circuit die, receiving and analyzing a plurality of different types of statistical information from the external chip stack; and in response to receiving and analyzing the plurality of different types of statistical information, using the control circuitry to maintain a balanced thermal profile across the external chip stack by rerouting requests to the external chip stack.

Example 16 is the method of example 15, wherein receiving the plurality of different types of statistical information optionally comprises receiving temperature readings from at least two dies in the external chip stack.

Example 17 is the method of any one of examples 15-16, wherein receiving the plurality of different types of statistical information optionally comprises receiving temperature measurements and other types of parameters different than the temperature readings.

Example 18 is the method of example 17, wherein the other types of parameters optionally comprise metrics selected from the group consisting of: a status signal, a number of commands, a bandwidth utilization metric, and a threshold value.

Example 19 is the method of any one of examples 15-18, optionally further comprising: comparing the statistical information to a predetermined threshold to determine whether command swizzling or throttling is needed.

Example 20 is a system, comprising: a package substrate; an interposer on the package substrate; a memory stack that includes multiple vertically stacked dies mounted on the interposer; and a main die that is mounted on the interposer and that comprises thermally aware monitoring and switching circuitry configured to ensure that the temperature of each of the vertically stacked dies in the memory stack is maintained below a predetermined thermal limit to prevent timing violations when accessing the memory stack.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. An integrated circuit, comprising:
    an interface circuit to communicate with an external die stack having a plurality of vertically stacked dies; and
    control circuitry to receive one or more parameters of the associated with the external die stack and to distribute accesses among the plurality of vertically stacked dies based at least upon the one or more parameters.

2. The integrated circuit of claim 1, wherein the one or more parameters comprise a memory bandwidth utilization metric.

3. The integrated circuit of claim 1, wherein the one or more parameters comprise a memory bank status, a number of commands, at least one threshold value, a number of page openings and closures, or any combination thereof.

4. The integrated circuit of claim 1, wherein the one or more parameters comprise a memory error threshold value.

5. The integrated circuit of claim 1, wherein the one or more parameters comprise a frequently accessed region pattern of a given die in the external die stack.

6. The integrated circuit of claim 1, wherein the one or more parameters comprise temperature data associated with more than one of the vertically stacked dies in the external die stack.

7. The integrated circuit of claim 6, wherein the temperature data includes a first temperature sensor measurement from a topmost die in the external die stack and a second temperature sensor measurement from a bottommost die in the external die stack.

8. The integrated circuit of claim 7, wherein the control circuitry is configurable to compute a temperature gradient based on the first and second temperature sensor measurements to estimate a temperature level for an intermediate die interposed between the topmost and bottommost dies in the external die stack.

9. The integrated circuit of claim 1, wherein the control circuitry comprises a memory controller circuit to throttle traffic intended for hot dies in the die stack.

10. The integrated circuit of claim 1, wherein the control circuitry comprises a memory controller circuit to reroute traffic from a congested channel to a less congested channel to balance a bandwidth profile of an entire die stack.

11. The integrated circuit of claim 1, wherein the control circuitry comprises switching circuitry to swizzle accesses to the external die stack such that cold dies in the die stack are accessed more often than hot dies in the die stack.

12. The integrated circuit of claim 11, wherein the switching circuitry comprises an address translation circuit to map logical addresses to corresponding physical addresses.

13. The integrated circuit of claim 12, wherein the address translation circuit is configurable to perform static address mapping.

14. The integrated circuit of claim 12, wherein the address translation circuit is configurable to perform dynamic address mapping.

15. The integrated circuit of claim 1, wherein the external die stack is configurable to store a main copy of a given data and a mirrored copy of the given data, and wherein the control circuitry is configurable to access a selected one of the main copy and the mirrored copy with the lower temperature.

16. A method of operating an integrated circuit die, comprising:
    with an interface circuit in the integrated circuit die, communicating with a chip stack;
    with control circuitry in the integrated circuit die, receiving and analyzing a plurality of different types of statistical data from the chip stack; and
    in response to receiving and analyzing the plurality of different types of statistical data, using the control circuitry to throttle accesses to the chip stack by rerouting requests to the chip stack.

17. The method of claim 16, wherein receiving the plurality of different types of statistical data comprises receiving a bandwidth utilization metric from at least two dies in the chip stack.

18. The method of claim 16, wherein receiving the plurality of different types of statistical data comprises receiving temperature measurements and other types of parameters different than the temperature readings.

19. The method of claim 17, wherein the other types of parameters comprise metrics comprise a status signal, a number of commands, or a threshold value, or any combination thereof.

20. A system, comprising:
    a package substrate;
    an interposer on the package substrate;
    a memory stack that includes multiple vertically stacked dies mounted on the interposer; and
    a main die that is mounted on the interposer and that comprises switching circuitry configurable to selectively access different dies of the memory stack based at least in part on a bandwidth utilization metric and a temperature of the vertically stacked dies in the memory stack.

* * * * *